United States Patent [19]

Plunkett

[11] 4,245,181
[45] Jan. 13, 1981

[54] METHOD AND APPARATUS FOR GENERATING AN AIR GAP FLUX SIGNAL FOR AN AC MACHINE FROM AC LINE VOLTAGE AND CURRENT VALUES

[75] Inventor: Allan B. Plunkett, Scotia, N.Y.

[73] Assignee: General Electric Company, Schenectady, N.Y.

[21] Appl. No.: 14,941

[22] Filed: Feb. 26, 1979

[51] Int. Cl.³ .................... H02P 5/28; H02P 7/36; G01R 33/00
[52] U.S. Cl. .................... 318/805; 318/798; 324/158 MG
[58] Field of Search .................... 324/158 MG; 318/798–803, 805

[56] References Cited

U.S. PATENT DOCUMENTS

| 3,441,823 | 4/1969 | Schlabach | 318/805 |
| 3,593,083 | 7/1971 | Blaschke | 318/803 |
| 3,775,652 | 11/1973 | Bowler et al. | 318/810 |
| 3,855,529 | 12/1974 | Langweiler | 324/158 MG |
| 3,909,687 | 9/1975 | Abbondanti | 318/805 |
| 4,011,489 | 3/1977 | Franz et al. | 318/798 |
| 4,119,893 | 10/1978 | Bayer et al. | 318/724 |

Primary Examiner—J. V. Truhe
Assistant Examiner—John B. Conklin
Attorney, Agent, or Firm—Marvin Snyder; James C. Davis

[57] ABSTRACT

A substantially smooth, continuous and sinusoidal air gap flux signal for an AC machine is provided from machine terminal voltages and line currents. A voltage representative of the machine stator voltage is combined with a voltage representative of the resistive voltage drop component across the stator to yield an intermediate voltage. This intermediate voltage is integrated and combined with a voltage representative of the stator flux leakage reactance to yield an air gap flux signal proportional to the difference between the integral of the intermediate voltage and the stator flux leakage reactance voltage.

12 Claims, 4 Drawing Figures

METHOD AND APPARATUS FOR GENERATING AN AIR GAP FLUX SIGNAL FOR AN AC MACHINE FROM AC LINE VOLTAGE AND CURRENT VALUES

BACKGROUND OF THE INVENTION

This invention relates to a method and apparatus for obtaining an air gap flux signal for an AC machine and, more specifically, to a method and apparatus for obtaining an air gap flux signal for an AC machine directly from terminal voltage applied to, and line current drawn by the machine.

In many applications where feedback control of an AC machine is desired, it is often useful to have some indication of the phase angle difference ($\theta$) between machine stator current and air gap flux. Such phase angle measurement typically is achieved by first deriving signals representing the air gap flux in each machine phase and then combining the air gap flux components with preselected components of stator current to yield a signal proportional to sin ($\theta$). Having an air gap flux signal which is substantially sinusoidal and free from notches and spikes is particularly useful when the AC machine is powered from a DC source by an inverter because then the phase angle signal sin ($\theta$) can be used to generate synchronizing information to control inverter thyristor firing intervals, thus synchronizing the inverter to the machine.

In the past, various approaches have been disclosed for developing an air gap flux signal for an AC machine. One such method disclosed in U.S. Pat. No. 3,855,529, issued June 14, 1971 to Langweiler teaches the placement of a measuring detector extending in the circumferential direction of the stator for determination of air gap flux. The detector is disclosed as being a Hall generator or group of Hall generators.

A major disadvantage with measurement of flux in this manner is that it requires modification of the motor to accommodate the detector. This requires additional expense and eliminates the use of off the shelf motors.

Another method for obtaining an air gap flux signal is disclosed in U.S. Pat. No. 3,909,687 issued Sept. 30, 1975 to Abbondanti and assigned to Westinghouse Electric Corporation. Abbondanti teaches the measurement of flux by generating a signal representative of the reactive power, $W_X$ in each phase of the machine. The reactive power $W_X$ is proportional to the square of the magnetization current $I_M$ which is, in turn, proportional to air gap flux.

The difficulty with the development of an air gap flux signal as disclosed in this manner is that it is dependent on the magnetization current $I_M$ of the machine. The magnetization current, $I_M$, is in turn, dependent on the machine construction and materials used therein. Thus, it is not inconceivable, owing to variations in the ferromagnetic properties of steel used in such motor construction, for $I_M$ to vary as much as 20% to 30% between two identically constructed motors. Hence, the flux signal may also vary in this amount.

Still another approach disclosed for developing an air gap flux signal within AC machines is taught in U.S. Pat. No. 3,593,083 issued July 13, 1971 to Blaschke. In the Blaschke disclosure, appropriate values of the line voltage, the line current, and the differential portion of the line current are combined and integrated to produce a signal proportional to machine air gap flux.

The major difficulty with the developement of an air gap flux signal from a combination of signals representing line current and the differential portion of line current becomes apparent if the line current signal waveform is not a smooth function. This often occurs when the machine is driven from a DC source by an inverter causing a current waveform having notches and spikes. Differentiation of the current as taught by Blaschke may lead to a discontinuous function thus resulting in an erroneous air gap flux signal.

The present invention alleviates these difficulties by providing an air gap flux signal for an AC machine directly from AC terminal voltages and line currents which signal is substantially smooth, continuous and sinusoidal notwithstanding variation in machine construction.

SUMMARY OF THE PRESENT INVENTION

Briefly, in accordance with a preferred embodiment of the invention, a substantially smooth, continuous and sinusoidal air gap flux signal for an AC machine is provided from AC machine terminal voltages and line currents according to the following method. A first voltage, representing the stator voltage, is developed and, is, in turn, algebraically summed with a voltage representing the resistive voltage drop component across the stator to yield a first intermediate voltage proportional in magnitude to the voltage difference therebetween. The first intermediate voltage signal is integrated to produce a second intermediate voltage, proportional in amplitude to the integral of the first intermediate voltage. The second intermediate voltage signal is then algebraically summed with a voltage proportional to the stator flux leakage reactance to yield an air gap flux signal proportional to the voltage difference between the second intermediate voltage and stator flux leakage reactance voltage.

In addition, an apparatus is disclosed for practicing the above-described method to generate an air gap flux signal. A first circuit, having a first input connected to receive the AC line voltage and a second input connected to receive the AC neutral voltage of the machine, combines the respective line and neutral voltages to produce a first voltage at the first circuit output which is representative of the machine stator voltage.

A stator current bus, supplied by the AC line current bus develops a voltage representative of the negative magnitude of the stator current drawn by the machine.

A second circuit is coupled between the stator current bus and the output of the first circuit and algebraically combines the first voltage with a voltage representative of the resistive voltage drop across the stator to yield, at the junction of the first and second circuits, a first intermediate voltage equal in magnitude to the voltage difference therebetween.

A third circuit is connected to the junction of the first and second circuits and generates a second intermediate voltage proportional to the integral of voltage present at the junction of the first and second circuits.

A fourth circuit, coupled to the stator current bus and the output of the third circuit, algebraically combines the second intermediate voltage produced by the third circuit with a voltage representative of the stator flux leakage reactance to yield an air gap flux signal, proportional in magnitude to the voltage difference therebetween.

It is an object of this invention to provide a method and apparatus for determining the air gap flux of an AC machine with relative insensitivity to machine construction variations.

It is another object of the present invention to provide a method and apparatus for obtaining an air gap flux signal for a conventional AC machine without requiring modification of the machine.

It is still a further object of this invention to provide, for an AC machine, an air gap flux signal which has a substantially smooth sinusoidal and transient free output waveform.

BRIEF DESCRIPTION OF THE DRAWINGS

The features of the invention believed to be novel are set forth with particularity in the appended claims. The invention, itself, however, both as to organization and method of operation, together with further objects and advantages thereof, may best be understood by reference to the following description taken in conjunction with the accompanying drawings in which:

DETAILED DESCRIPTION OF THE PREFERRED EMBODIMENT

Figure 1A:
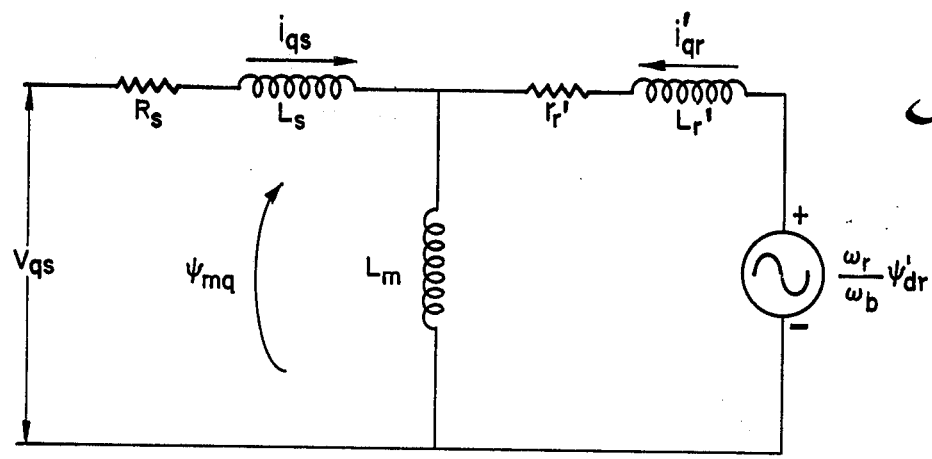
FIG. 1a is an equivalent quadrature or Q axis circuit diagram of an induction motor in a stationary reference frame.
Figure 1B:
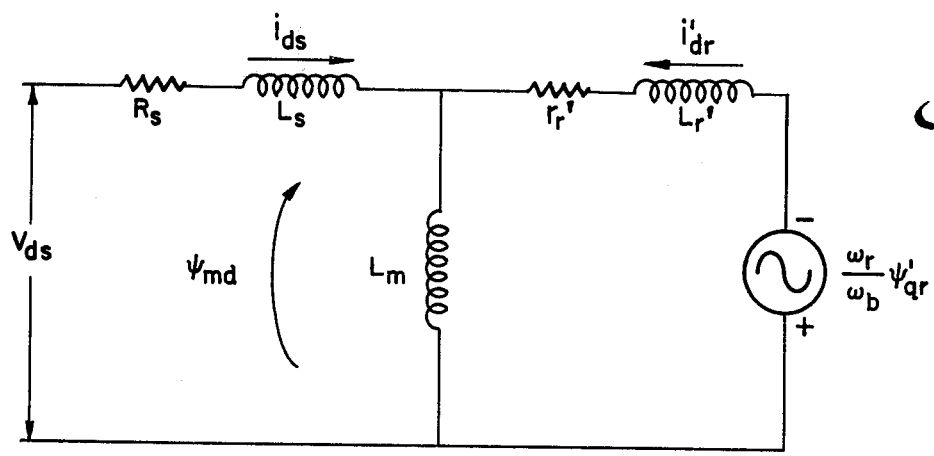
FIG. 1b is an equivalent direct or D axis circuit diagram of an induction motor in a stationary reference frame.

In FIGS. 1a and 1b, respectively, there are shown schematic diagrams of the equivalent quadrature (Q) and direct (D) axes circuits of an induction motor in a stationary reference frame. The quadrature axis equivalent induction motor circuit of FIG. 1a comprises a first series circuit, representing the stator, which is configured of a resistor $R_s$ representing the stator resistance, an inductor $L_s$ representing the stator inductance, and an inductor $L_m$ representing the motor magnetizing reactance. A second series circuit, coupled in parallel with inductor $L_m$, represents the rotor and is configured of a resistor $r_r'$ representing the rotor resistance, an inductor $L_r'$ representing the rotor inductance, and a voltage source representing the motor emf in the quadrature axis and being of a magnitude $(\omega_r/\omega_b)\psi'$ where:

$\omega_r$ = angular frequency of rotation $\omega_b$ = rated machine frequency at which the magnitude of air gap flux equals air gap voltage $\psi'_{dr}$ = D axis component of mutual flux linking inductors $L_s$ and $L_m$.

The configuration of the direct axes equivalent induction motor circuit of FIG. 1b is identical to that described for the quadrature axes equivalent circuit of FIG. 1a with the exception, that the magnitude of the voltage source in the direct axis series rotor circuit is given by $\omega_r/\omega_b)\psi'_{qr}$ where $\psi'_{qr}$ is the quadrature axis component of mutual flux linking inductors $L_m$ and $L_s$.

Flux linkages $\psi_{mq}$ and $\psi_{md}$ of inductor $L_m$ in the quadrature and direct axes circuits of FIGS. 1a and 1b, respectively, represent the quadrature and direct components, respectively, of air gap flux.

To develop appropriate equations for the stator terminal voltage components $V_{qs}$ and $V_{ds}$ in the Q and D axes, respectively, the voltage drop across the respective circuit elements $R_s$ and $L_s$ and the quadrature and direct air gap voltage denoted $V_{mq}$ and $V_{md}$, respectively, are summed to yield equations (1) and (2):

$$V_{qs} = i_{qs} R_s + p[L_s i_{qs}] + V_{mq} \tag{1}$$

$$V_{ds} = i_{ds} R_s + p[L_s i_{ds}] + V_{md} \tag{2}$$

where $i_{qs}$ and $i_{ds}$ are the stator current components in the Q and D axes respectively and p is the differential operator d/dt.

From equations (1) and (2), respectively, appropriate relationships for the voltage $V_{mq}$ across the air gap in the Q axis and $V_{md}$ the voltage drop across the air gap in the D axis may be developed as shown by equations (3) and (4).

$$V_{mq} = V_{qs} - i_{qs} R_s - p[L_s i_{qs}] \tag{3}$$

$$V_{md} = V_{ds} - i_{ds} R_s - p[L_s i_{ds}] \tag{4}$$

The flux linkages $\psi_{mq}$ and $\psi_{md}$ are related to the air gap voltages $v_{mq}$ and $V_{md}$, respectively, as seen by equations (5) and (6):

$$p(\psi_{mq})/\omega_b = V_{mq} \tag{5}$$

$$p(\psi_{md})/\omega_b = V_{md} \tag{6}$$

Equations (3) and (5) may be combined to yield equation (7), and equations (4) and (6) may be combined to yield equation (8).

$$p(\psi_{mq})/\omega_b = V_{qs} - R_s i_{qs} - P[L_s i_{qs}] \tag{7}$$

$$p(\psi_{md})/\psi_b = V_{ds} - R_s i_{ds} - P[L_s i_{ds}] \tag{8}$$

The conventional approach for solving equations (7) and (8) to obtain the air gap flux linkages $\psi_{mq}$ and $\psi_{md}$ is by integration. It should be noted that equations (7) and (8) contain terms proportional to the time derivative of the quadrature and direct stator current terms, respectively. If the respective direct and quadrature stator current components do not have smooth continuous waveforms, the resulting derivative terms $p[L_s i_{qs}]$ and $p[L_s d_s]$ in equations (7) and (8) will not be sinusoidal but, rather, will exhibit notches and spikes and will tend to overload associated signal conditioning electronics.

The drawback of having the quadrature and direct components of air gap flux dependent on the time derivative of the direct and quadrature stator current components is resolved according to the present invention by arranging the relationship among the air gap flux terms, the stator voltage terms $V_{qs}$ and $V_{ds}$, the resistive voltage drop component terms $i_{qs} R_s$ and $i_{ds} R_s$, and the stator flux leakage reactance component terms $i_{qs} L_s$ and $i_{ds} L_s$ to yield relationships for the air gap flux linkages as represented by equations (9) and (10), respectively:

$$\psi_{mq} = \omega_b \left[ \frac{[V_{qs} - i_{qs} R_s]}{p} - L_s i_{qs} \right] \tag{9}$$

$$\psi_{md} = \omega_b \left[ \frac{[V_{ds} - i_{ds} R_s]}{p} - L_s i_{ds} \right] \tag{10}$$

Equations (9) and (10) show that the resistive voltage drop component and stator flux leakage reactance voltage terms are separated and that the need for differentiation is eliminated. Instead, the magnitude of the voltage difference between the stator voltage and resistive voltage drop across the stator is integrated and combined with the stator flux leakage reactance voltage to yield the expessions for air gap flux as given above. Although actual motor stator resistance does vary in accordance with motor temperature, the motor temperature variation over the normal motor operating range has little effect on the calculation of air gap flux because at normal operating frequencies, the terms $i_{qs}$ and $i_{ds}R_s$ are much smaller than $V_{qs}$ and $V_{ds}$, respectively.

Equations (9) and (10) can be expressed more generally by equation (11):

$$\psi = \omega_b \left[ \frac{[V_s - I_s R_s]}{p} - L_s I_s \right] \quad (11)$$

where $\psi$, $V_s$, $I_s$, $R_s$ and $L_s$ represent either the direct or quadrature axis quantities as the case may be.

Figure 2:
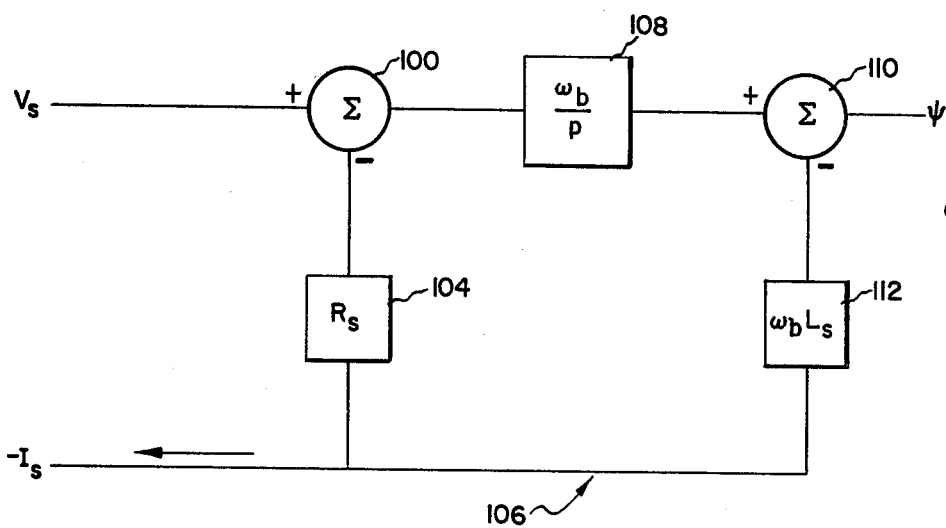
FIG. 2 is a block diagram of the apparatus, according to the present invention, for producing an air gap flux signal for an AC machine.

The circuitry, in accordance with the present invention, for producing an analog solution to equation (11) is shown in block form in FIG. 2. A voltage signal, $V_s$, proportional to the stator voltage, is impressed at the first input of a first summing amplifier 100. A second voltage, representing the resistive voltage drop component $I_s R_s$ across the stator, is developed at the second input of summing amplifier 100 by the connection of impedance 104, having a magnitude corresponding to the resistance of the stator, between the second input of summing amplifier 100 and current bus 106, which carries a current proportional to the negative magnitude of the stator current $I_s$. The output of summing amplifier 100 is, in turn, coupled to the input of integrator 108, which develops, at its output, a voltage proportional to the integral of the voltage impressed at the integrator input. The function of the scaling factor $\chi_b$ will be described hereinafter.

The output of integrator 108 is coupled to the first input of a second summing amplifier 110 while the second amplifier input is impressed with a voltage representative of the stator flux leakage reactance, which voltage is produced by passing stator current through a resistance 112 which is of magnitude proportional to the inductance of the stator and is coupled between current bus 106 and the second input of summing amplifier 110.

The analog solution to equation (11) is produced by operation of the above described circuitry as follows. When a voltage $V_s$, proportional to the stator voltage, is impressed at the first input of summing amplifier 100, and a current $-I_s$ proportional in magnitude to the stator current is passed through bus 106, a voltage proportional to the difference between the stator voltage and the resistive voltage drop across the stator, corresponding to the expression $(V_s - I_s R_s)$, is developed at the output of summing amplifier 100. Integrator 108 integrates the voltage at the output of amplifier 100, resulting in the integrator output voltage magnitude corresponding to the term $[V_s - I_s R_s]/p$ in equation (11).

Summing amplifier 110 algebraically combines the integrator output voltage with the stator flux leakage reactance voltage represented by the voltage drop across resistance 112, to yield a voltage corresponding to the machine air gap flux in accordance with the expression $[V_s - I_s R_s/p] - L_s I_s$, which is proportional to the right-handside of equation (11).

To adjust the magnitude of the voltage developed at the output of summing amplifier 110 so that it is equal in magnitude to the machine air gap voltage, the output voltage of integrator 108 and the magnitude of resistance 112 are scaled by the factor $\omega_b$, the rated machine frequency.

Figure 3:
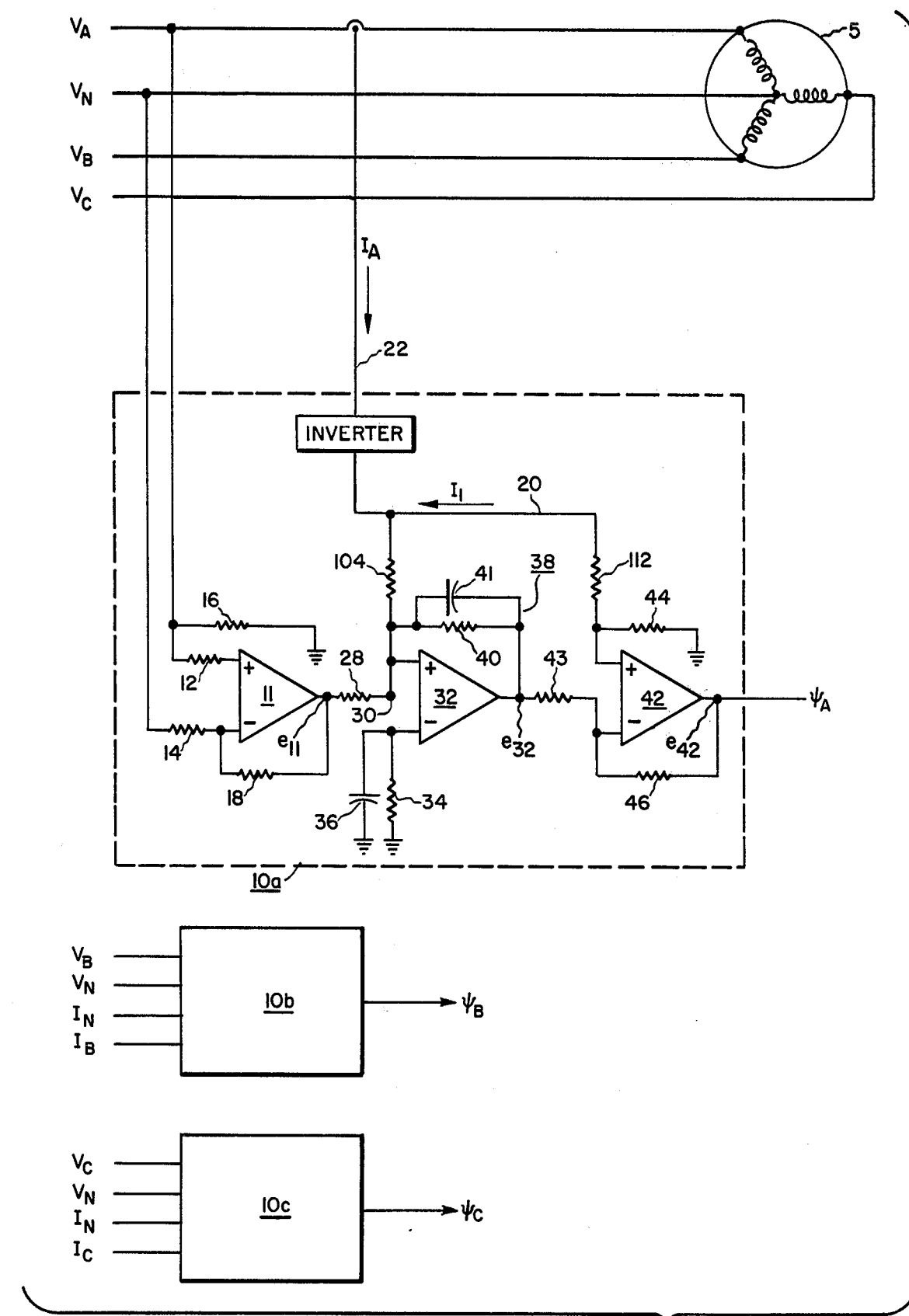
FIG. 3 is a schematic diagram of the apparatus, according to the present invention, connected to each of three phases of an AC machine for developing an air gap flux signal for each machine phase.

Referring now to FIG. 3, a schematic diagram corresponding to the circuit of FIG. 2 for generating an air gap flux for one phase of a three phase AC machine 5 is accorded the reference number 10a. Identical flux measuring circuits to that of 10a for generating air gap flux signals for the corresponding remaining phases of AC machine 5 are shown in blocks 10b and 10c, respectively. The line voltage $V_A$, at the first terminal of AC machine 5, is applied to the first input of a first differential amplifier 11 through resistance 12. The machine neutral voltage $V_N$ is applied to the second input of amplifier 11 through a resistance 14. The line voltage $V_A$ and the neutral voltage $V_N$ are respectively referenced to ground by the connection of resistance 16 between the first input of amplifier 11 and circuit ground. A feedback resistance 18 is coupled between the second input of amplifier 11 and the amplifier output and serves in combination with resistances 12, 14 and 16 to determine the gain of amplifier 11. This may be seen as follows.

In practice, amplifier 11 is chosen as a differential amplifier having an input impedance substantially greater in magnitude than the output impedance. The gain of amplifier 11 can be represented by:

$$A = \frac{V_{OUT}}{V_{IN}} = \frac{e_{11}}{V_A - V_N} \quad (12)$$

where $e_{11}$ represents the voltage of the output of amplifier 11 measured with respect to ground. By conventional circuit analysis, the output voltage $e_{11}$ can be expressed as:

$$e_{11} = \left( \frac{R_{16}}{R_{12} + R_{16}} \right) \left( 1 + \frac{R_{18}}{R_{14}} \right) V_A - \frac{R_{18}}{R_{14}} V_N$$

where $R_{12}$, $R_{14}$, $R_{16}$ and $R_{18}$ denote the ohmic value of resistances 12, 14, 16 and 18, respectively. In practice $R_{12} = R_{14}$ and $R_{18} = R_{16}$ yielding $$A = \frac{e_{11}}{V_A - V_N} = \frac{R_{18}}{R_{14}} \quad (14)$$

Thus, the output voltage $e_{11}$ is directly proportional to the expression $(V_A - V_N)$ and is therefore representative of the phase stator voltage which is denoted by $V_1$.

A current bus 20 which develops a voltage representative of the negative magnitude of the phase stator current denoted by $I_1$ is supplied from the connection of a current bus 22 which carries a current proportional to the negative magnitude of the line currrent $I_A$.

The output of amplifier 11 is connected through resistance 28 to circuit node 30, which node is coupled to the first input of a second differential amplifier 32. Resistance 104, having a magnitude proportional to the resistance of the stator, is coupled between current bus 20 and node 30 so that the net voltage $V_{30}$ at node 30 corresponds to the voltage difference between the output voltage $e_{11}$ of amplifier 11 (representative of the phase stator voltage $V_1$) and the voltage drop across resistance 104 (representative of the phase resistive voltage drop across the stator $I_1 R_s$). The second input of operational amplifier 32 is coupled to ground by the parallel connection of resistance 34 and capacitor 36 which combination serves to reference the input voltage present at the first input of amplifier 32 with respect to circuit ground.

Feedback impedance 38, comprised of resistance 40 and capacitor 41 in parallel, is connected between the first input of amplifier 32 and the amplifier output, and causes the amplitude of the voltage $e_{32}$ at the output of amplifier 32 to be scaled proportional to the integral of the sum of the currents through resistances 28 and 104. This may be seen as follows. In practice, the input impedance of amplifier 32 is much greater in magnitude than the combined impedance of resistance 34 and capacitor 36, resulting in only a negligible voltage appearing across resistance 34 and capacitor 36. Neglecting this voltage, the output voltage of amplifier 32 can be expressed as:

$$e_{32} = -(e_{11}/R_{28} + V_{104}/R_{104}) Z_{38} \quad (15)$$

where $R_{28}$ and $R_{104}$ are the ohmic values of resistances 28 and 104, respectively, $V_{104}$ is the voltage across resistance 104 and $Z_{38}$ is the magnitude of feedback impedance 38.

Equation (15) reveals that the output voltage $e_{32}$ of amplifier 32 is proportional to the sum of the currents through resistance 28 and 104 which, in turn, corresponds to the difference between the phase stator voltage $V_1$ and the phase resistive voltage drop $I_1 R_s$ across the stator. If feedback impedance 38 were purely reactive, (resistance 40 being infinite) then the magnitude of $Z_{38}$ would be given by:

$$Z_{38} 1/(j\omega_s C_{41})$$

where $C_{41}$ is the capacitance of capacitor 41 and $\omega_s$ is the stator current frequency, resulting in the output voltage $e_{32}$ of amplifier 32 being proportional to the integral of the difference between the phase stator voltage $V_1$ and the phase resistive stator voltage drop $I_1 R_s$.

However, in practice, a net DC offset may be present at the second input of amplifier 32, necessitating that the integration interval be limited over a preselected frequency range. Thus, by according resistance 40 of feedback impedance 38 a finite value, $Z_{38}$ can be expressed as:

$$Z_{38} = \frac{(1/(j\omega_s C_{41}))(R_{40})}{R_{40} + 1/j\omega_s C_{41}} = \frac{R_{40}}{R_{40} j\omega_s C_{41} + 1}$$

where $R_{40}$ denotes the magnitude of resistance 40. For frequencies where $R_{40} j\omega_s C''$ (the normal operating range) $Z_{38}$ will be given approximately by equation (16) resulting in the voltage $e_{32}$ being proportional to the integral of the difference in voltage between $V_1$ and $I_1 R_s$. For frequencies where $R_{40} j\omega_s C_{41}$ $e_{32}$ is scaled by the magnitude of resistance 40.

The output voltage of amplifier 32, representing the integral of the input voltage impressed at the first amplifier input, is applied to the first input of a third differential amplifier 42 through a resistance 43. A voltage representing the phase stator flux leakage reactance is impressed at the second input of amplifier 42 as a result of the connection of resistance 112, having a magnitude proportional to the inductance of the stator, between current bus 20 and the second input of amplifier 42. Resistance 44, coupled between the second input of amplifier 42 and circuit ground, serves to reference the input voltage at the first amplifier input with respect to circuit ground. A feedback impedance 46 is coupled between the first input of amplifier 42 and the output thereof and serves, together with resistance 43 and 112, to determine output voltage $e_{42}$ of amplifier 42 as follows. Amplifier 42, as with amplifiers 32 and 11, is chosen having an input impedance substantially greater in magnitude than the output impedance. Thus, by conventional circuit analysis, the output voltage $e_{42}$ of amplifier 42 can be given by:

$$e_{42} = \left[ \left( \frac{R_{44}}{R_{112} + R_{44}} \right) \left( 1 + \frac{R_{46}}{R_{43}} \right) \right] V_{20} - \frac{R_{46}}{R_{43}} e_{32}$$

where $R_{44}$, $R_{112}$, $R_{46}$, $R_{43}$ each represents the ohmic value of resistance 44, 112, 46 and 43, respectively, and $V_{20}$ represents the voltage on conductor 20. In practice, $R_{43} = R_{46} = R_{44}$ which simplifies equation (18) to yield:

$$e_{42} = \frac{2 R_{44}}{R_{112} + R_{44}} V_{20} - e_{32}$$

Recalling that $e_{32}$ is, above a preselected frequency, proportional to the integral of the difference between the phase stator voltage and the phase resistive voltage drop component, and noting, the voltage across resistance 44, represents the phase stator flux leakage reactance, it may easily be seen that the output voltage $e_{42}$ represents the phase air gap flux in accordance with equation (11).

As noted above, the circuit according to the present invention produces a smooth, continuous and substantially sinusoidal air gap flux signal for a particular machine phase. Although not shown mathematically, the air gap flux signals for each of the corresponding three phases of three phase AC machine 5 may be appropriately combined to yield air gap flux signals representative of the air gap flux for the direct and quadrature axes of the AC machine. Additionally, the circuit according to the present invention may be equally useful for directly generating air gap flux signals corresponding to the direct and quadrature air gap flux components from voltages representing the direct and quadrature line and neutral voltages, respectively, and from stator currents representing the direct and quadrature stator current components, respectively.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

What is claimed is:

1. A method for providing, from AC machine terminal voltages applied to, and current drawn by, said AC machine, a substantially smooth, continuous and sinusoidal signal representative of the air gap flux within an AC machine, comprising the steps of:

(a) deriving from the AC machine terminal voltage a voltage representative of the stator voltage within the machine;

(b) generating a first intermediate voltage proportional in magnitude to the voltage difference between said voltage representing the stator voltage and a voltage representing the resistive voltage drop component across the AC machine stator;

(c) integrating said first intermediate voltage to yield a second intermediate voltage; and (d) algebraically summing said second intermediate voltage with a voltage representative of the stator flux leakage reactance of the AC machine stator to yield an air gap flux signal proportional to the voltage difference therebetween.

2. The method according to claim 1 wherein said first intermediate voltage is integrated only above a preselected frequency while below said frequency said first intermediate voltage is scaled by a fixed proportion.

3. The method according to claim 1 further including the step of scaling said air gap flux signal by a factor proportional to the rated machine frequency to produce an air gap flux signal having a magnitude equal to the air gap voltage at a nominal machine operating mode corresponding to rated machine frequency.

4. The method according to claim 1 wherein said stator voltage is derived by algebraically summing the AC machine line voltage and the AC machine neutral voltage.

5. The method according to claim 1 wherein said voltage representative of the resistive voltage drop component across the stator is developed by current proportional in amplitude to the machine stator current passing through a resistance proportional in magnitude to the stator resistance.

6. The method according to claim 1 wherein said voltage representative of the stator flux leakage reactance is developed by current proportional in amplitude to the machine stator current passing through a resistance proportional in magnitude to the inductance of the machine stator.

7. Apparatus for obtaining from AC machine terminal voltages applied to, and current drawn by, said AC machine, an electrical signal having a smoothly continuous and substantially sinusoidal waveform proportional to the air gap flux within said machine, said apparatus comprising:

(a) first circuit means having an output, a first input adapted to receive the AC line voltage, and a second input adapted to receive the AC neutral voltage, for algebraically summing said AC line voltage and said AC neutral voltage to produce a voltage at the output representative of the stator voltage within said machine;

(b) stator current bus means coupled to receive currents proportional in amplitude to the line current for developing a voltage proportional to the negative magnitude of the AC machine stator current;

(c) second circuit means connected between said stator current bus means and the output of said first circuit means for algebraically summing the AC machine stator voltage produced by said first circuit means with a voltage representative of the resistive voltage drop component across the stator to yield a first intermediate voltage signal;

(d) third circuit means having an input coupled to the junction of said first and second circuit means for integrating said first intermediate voltage to produce an output voltage proportional to the integral of the amplitude of said first intermediate voltage; and (e) fourth circuit means having a first input coupled to said stator current bus means and a second input coupled to the output of said third circuit means for algebraically combining the voltage at the output of said third circuit means with a voltage representative of the stator flux leakage reactance of the AC machine to yield a signal representative of the air gap flux within the AC machine.

8. The invention according to claim 7 wherein said first circuit means includes a differential amplifier.

9. The invention according to claim 7 wherein said second circuitmeans comprises a resistance coupled between said stator current bus means and the output of said first circuit means, said resistance having a magnitude such that current therethrough generates a voltage thereacross proportional to the magnitude of the resistive voltage drop component across the AC machine stator.

10. The invention according to claim 7 wherein said third circuit means comprises:

(a) a differential amplifier having first and second input terminals and an output terminal;

(b) means coupling said first amplifier input terminal to the junction of said first and second circuit means;

(c) means coupling said second amplifier input terminal to circuit ground; and (d) a feedback impedance coupled between said first amplifier input terminal and said amplifier output terminal, said feedback impedance being dependent upon frequency such that the output of said differential amplifier will, above a preselected frequency, be proportional to the integral of the amplitude of the input voltage impressed at said first amplifier input terminal while, below said preselected frequency, the output of said amplifier will be proportional to a multiple of the voltage at the first input terminal thereof.

11. The invention according to claim 10 wherein said feedback impedance comprises the parallel combination of a resistance and a capacitor.

12. The invention according to claim 7 wherein said fourth circuit means includes:

(a) a differential amplifier having a first input terminal, a second input terminal, and an output terminal;

(b) means coupling said first amplifier input terminal to the output of said third circuit means;

(c) a feedback impedance coupled between said first amplifier input terminal and said amplifier output terminal; and (d) a resistance having a magnitude proportional to the inductance of the AC machine stator coupled between said stator current bus means and said second amplifier input terminal; said amplifier producing at the output terminal thereof an air gap flux signal proportional in magnitude to the amplitude difference between voltage at said first amplifier input terminal and a voltage representing the stator flux leakage reactance of said AC machine.

* * * * *